United States Patent
Stocker et al.

(10) Patent No.: US 11,041,923 B2
(45) Date of Patent: Jun. 22, 2021

(54) DIRECTLY COOLABLE MULTIFILAMENT CONDUCTOR

(71) Applicant: Siemens Healthcare GmbH, Erlangen (DE)

(72) Inventors: Stefan Stocker, Grossenseebach (DE); Peter Dietz, Fuerth (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/536,379

(22) Filed: Aug. 9, 2019

(65) Prior Publication Data
US 2020/0049780 A1 Feb. 13, 2020

(30) Foreign Application Priority Data
Aug. 9, 2018 (EP) ..................... 18188196

(51) Int. Cl.
*G01R 33/385* (2006.01)

(52) U.S. Cl.
CPC ................. *G01R 33/3856* (2013.01)

(58) Field of Classification Search
CPC .................................. G01R 33/3856
See application file for complete search history.

(56) References Cited

U.S. PATENT DOCUMENTS

| | | | |
|---|---|---|---|
| 3,737,989 A | 6/1973 | Schaetti | |
| 6,208,141 B1* | 3/2001 | Amor, Sr. | G01R 33/385 324/307 |
| 6,741,152 B1* | 5/2004 | Arz | G01R 33/3856 174/15.1 |
| 6,774,631 B2* | 8/2004 | Heid | G01R 33/3856 324/318 |
| 6,819,107 B2* | 11/2004 | Heid | G01R 33/385 324/318 |
| 6,844,731 B2* | 1/2005 | Endt | G01R 33/3856 324/318 |
| 7,015,692 B2* | 3/2006 | Clarke | G01R 33/3403 324/300 |
| 7,135,863 B2* | 11/2006 | Arik | G01R 33/3856 324/318 |
| 7,140,420 B2* | 11/2006 | Arik | G01R 33/3804 165/80.2 |
| 7,154,270 B2* | 12/2006 | Arz | G01R 33/3856 324/318 |
| 7,292,036 B2* | 11/2007 | Ham | G01R 33/3854 324/318 |

(Continued)

FOREIGN PATENT DOCUMENTS

| | | |
|---|---|---|
| CA | 1210464 A | 8/1986 |
| CA | 1241703 A | 9/1988 |
| CN | 106910553 A | 6/2017 |

OTHER PUBLICATIONS http://www.veoliawatertech.com/crownsolutions/ressources/documents/2/21993,Water-pp485.pdf (Year: 2005).*

*Primary Examiner* — Dixomara Vargas
(74) *Attorney, Agent, or Firm* — Schiff Hardin LLP

(57) ABSTRACT

A directly coolable multifilament conductor or a magnetic coil, having at least two electric conductors and at least one cooling tube disposed between the conductors adapted to carry a fluid coolant, wherein the cooling tube is a metal conductor having a lower conductivity than the conductors surrounding the tube.

13 Claims, 3 Drawing Sheets

(56) References Cited

U.S. PATENT DOCUMENTS

| | | | |
|---|---|---|---|
| 7,339,376 B2* | 3/2008 | Liu | G01R 33/3856 324/318 |
| 7,439,741 B2* | 10/2008 | Arik | G01R 33/3804 324/309 |
| 7,489,131 B2* | 2/2009 | Lvovsky | G01R 33/3856 324/300 |
| 7,495,444 B2* | 2/2009 | Schuster | G01R 33/3856 324/318 |
| 7,508,209 B2* | 3/2009 | Dietz | G01R 33/3856 324/306 |
| 7,589,531 B2* | 9/2009 | Yamashita | G01R 33/3856 324/318 |
| 8,991,036 B2* | 3/2015 | Fath | G01R 33/3858 29/605 |
| 9,470,768 B2* | 10/2016 | Huber | G01R 33/3856 |
| 9,810,754 B2* | 11/2017 | Tanaka | G01R 33/3856 |
| 9,869,734 B2* | 1/2018 | Mathieu | G01R 33/3858 |
| 10,168,400 B2* | 1/2019 | Tomiha | G01R 33/34076 |
| 10,470,662 B2* | 11/2019 | Lips | A61B 6/037 |
| 10,481,229 B2* | 11/2019 | Kusahara | G01R 33/4824 |
| 2001/0033168 A1* | 10/2001 | Heid | G01R 33/3856 324/322 |
| 2003/0218460 A1* | 11/2003 | Heid | G01R 33/385 324/318 |
| 2005/0030028 A1* | 2/2005 | Clarke | G01R 33/3403 324/318 |
| 2005/0035764 A1* | 2/2005 | Mantone | G01R 33/3856 324/318 |
| 2005/0093543 A1* | 5/2005 | Arik | G01R 33/3856 324/318 |
| 2005/0146330 A1* | 7/2005 | Teklemariam | G01R 33/385 324/318 |
| 2005/0168222 A1* | 8/2005 | Arz | G01R 33/3856 324/318 |
| 2007/0069843 A1* | 3/2007 | Arik | G01R 33/3804 336/55 |
| 2007/0085542 A1* | 4/2007 | Ham | G01R 33/3854 324/318 |
| 2008/0024134 A1* | 1/2008 | Schuster | G01R 33/3856 324/319 |
| 2008/0169813 A1* | 7/2008 | Yamashita | G01R 33/4215 324/321 |
| 2008/0259560 A1* | 10/2008 | Lvovsky | G01R 33/3856 361/689 |
| 2012/0240385 A1* | 9/2012 | Teklemariam | G01R 33/385 29/592.1 |
| 2012/0317795 A1* | 12/2012 | Fath | G01R 33/3858 29/605 |
| 2013/0075068 A1* | 3/2013 | Huber | G01R 33/3856 165/168 |
| 2013/0229183 A1* | 9/2013 | Kimmlingen | G01R 33/3403 324/322 |
| 2013/0296689 A1* | 11/2013 | Okamoto | A61B 6/4417 600/411 |
| 2014/0203809 A1* | 7/2014 | Tanaka | G01R 33/3804 324/318 |
| 2015/0346297 A1* | 12/2015 | Naka | G01R 33/307 324/322 |
| 2015/0362570 A1* | 12/2015 | Sakakura | G01R 33/4215 324/319 |
| 2016/0047870 A1* | 2/2016 | Ham | G01R 33/3858 324/322 |
| 2017/0038444 A1 | 2/2017 | Seeber | |
| 2017/0139023 A1* | 5/2017 | Kusahara | G01R 33/4818 |
| 2018/0120394 A1 | 5/2018 | Seeber | |

* cited by examiner

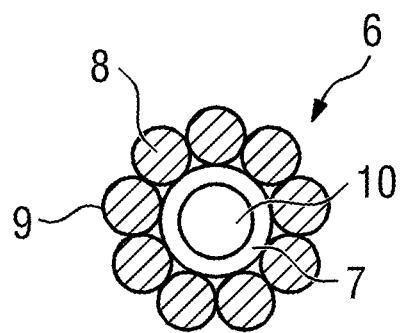
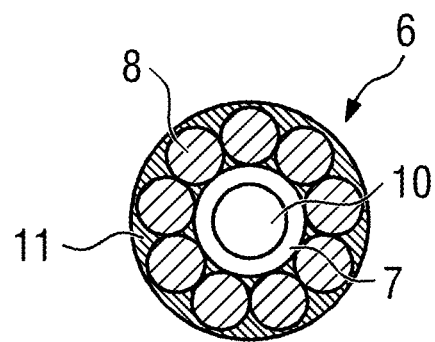
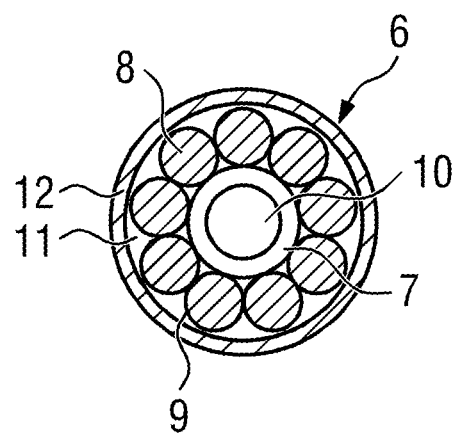

DIRECTLY COOLABLE MULTIFILAMENT CONDUCTOR

FIELD OF THE DISCLOSURE

The invention relates to a directly coolable multifilament conductor means for a magnetic coil, comprising at least two electric conductors and at least one cooling tube disposed between the conductors adapted to carry a fluid cooling means.

BACKGROUND

A directly coolable multifilament conductor means as depicted above is for example used for building a magnetic coil in form of or being part of a gradient coil of a magnetic resonance apparatus. In order to assure operation of a magnetic coil it is necessary to maintain the temperature of the coil below a maximally allowed temperature. It is necessary to efficiently eliminate the electrical dissipated power that arises in the form of heat produced when operating the magnetic coil. Since in many applications, for example when operating a gradient coil, a dissipated power in the order of more than 20 KW can be involved, considerable demands are made on the cooling system.

A magnetic coil comprising a directly coolable multifilament conductor means is disclosed in U.S. Pat. No. 6,741,152 B1. The conductor means comprises at least two profiled electrical conductor segments which when fitted together form an opening with a cooling tube being enclosed in this opening between the segmented conductors, with the cooling tube being adapted to carry a fluid cooling means for directly cooling the conductors and for transporting the dissipated heat. The tube is made of a non-conductive flexible plastic or polymer material, which material also encloses the segmented conductors being disposed at the sides of the rectangular inner tube. The polymer or plastic tube is fluid tight, leakage problems can be avoided. Such a multifilament conductor means is advantageous compared to a monolithic hollow conductor, which allows for a direct cooling of the conductor but which is subjected to eddy currents, which are one of the natural sources for the heating of the conductor, especially when high frequencies are used as for example at the magnetic resonance imaging. A directly coolable multifilament conductor means as for example disclosed in U.S. Pat. No. 6,741,152 B1 is less sensitive to eddy currents, which may not only lead to heating the conductor but may also create non-compensatable magnetic eddy current fields which are negative for example for the imaging procedure.

The integrated tube allows for a good cooling of the conductor. As the tube needs to have a certain cross section to have the necessary flow rate of the cooling fluid flowing through the conductor, the effective conductor cross section, which is determined by the conductive filaments arranged at the sides of the cooling tube, is quite small, compared to the overall cross section of the whole conductor means.

SUMMARY

It is an object of the invention to provide an improved directly coolable multifilament conductor means for a magnetic coil having good electric properties with a low sensitivity to eddy currents as well as a good cooling property.

The object is inventively achieved with a directly coolable multifilament conductor means for a magnetic coil, characterized in that the cooling tube is a metal conductor having a lower electrical conductivity than the conductors surrounding the tube.

According to the invention the tube adapted to carry a fluid cooling means also acts as a filament adapted to carry the current when the magnetic coil is in operation. It therefore has a double function. This is achieved by providing a cooling tube made of metal, so that the cooling tube can act as a conductor. The tube is therefore also a filament, which allows for minimizing the eddy currents in the conductor means and provides a good cooling of the conductor means due to the small thermal resistance between the cooling means and the heat sources, i.e. the conductors. As the tube is made of metal it also participates in carrying the current. But as the cooling tube is made of metal having a lower conductivity than the material the surrounding conductors are made of, the tube shows a lower sensitivity to eddy currents. It is therefore possible to integrate a cooling tube having a sufficient cross section for allowing a sufficient fluid rate to be transported through the tube. Due to the low sensitivity to eddy currents of the tube material the tube may therefore have a larger effective eddy current surface, compared to the filament conductors, but does not dominate or significantly negatively influence the electrical properties in view of eddy currents.

So the inventive multifilament conductor means provides a very good cooling efficiency and very good electrical properties with a reduction of unwanted eddy current effects.

The tube is preferably made of steel, especially stainless steel, while the conductors are made of copper or aluminium. Steel, especially stainless steel, shows very good properties regarding its electrical conductivity and the thermo conductivity, but also the mechanical properties. It also shows a very low tendency to erosion and a very tendency to transmit ions into the liquid cooling means. Another advantage is the possibility to produce a hollow filament conductor with a very thin wall thickness. Due to the lower electrical conductivity of the tube material it is advantageous to use a tube with a very small material cross section to avoid that the effective conductor cross section of the overall conductor becomes too large and to avoid rising of the thermal resistance. As the hollow tube has a significantly larger diameter or cross section compared to the monolithic conductor filament the lower conductivity of the steel will lead to a significant reduction of the negative eddy current effects.

The metal respectively the steel the tube is made of preferably shows no or negligible magnetic properties, even if it is deformed when the conductor means is bent, as the conductor means usually is when the magnetic coil, especially a gradient coil is produced, in order to avoid any inhomogeneities of the overall created magnetic field.

The tube has preferably a wall thickness between 0.5-1.5 mm, while the thickness is preferably as low as possible as explained above.

Furthermore, the tube may either have a rectangular cross section or a circular cross section, with the conductors being arranged only locally at the sides of the tube or surrounding the rectangular or circular tube.

In case the tube has a rectangular cross section it preferably has a width between 2-10 mm, especially between 3-7 mm, and a height between 2-10 mm, especially between 3-7 mm. The hollow cross section can vary depending on various parameters in order to ascertain that the necessary flow rate of the liquid cooling means can flow through the tube while also avoiding that the tube cross section is too large for the intended application, so that the overall cross section of the conductor means can vary in a larger range with optimized cooling properties.

The same is true for a circular tube, which also preferably has an outer diameter between 2-10 mm, especially between 3-7 mm.

Just as the tube shape may vary, also the cross section of the filament conductors may vary. The conductors may either have a rectangular, or a circular cross section. In case they have a rectangular cross section, they preferably have a width between 1-8 mm, especially between 1-5 mm, and a height between 2-10 mm, especially between 3-7 mm. Depending on the number of rectangular conductors, which are preferably used in combination with a rectangular tube, the conductor dimensions are chosen. It is possible to arrange several stacked conductors adjacent to the side of the tube, which conductors have a smaller width and height compared to the tube. But it is also possible to use at least one conductor at opposing sides of the rectangular tube having the same height as the tube etc. There are several different layouts possible.

If circular conductors are used, they preferably have a diameter between 2-10 mm, especially between 3-7 mm. These circular semiconductors will preferably be used in combination with a circular tube, they are preferably surrounding the tube in at least one circular arrangement, but also a double or multi-layer arrangement is possible.

For a further improvement of the conductor means it is possible that the conductors are twisted around the tube, which is especially possible with circular conductors and a circular tube. This twisted arrangement has a positive effect in further reducing the eddy currents.

The conductors themselves may comprise an isolating surface coating, for example a varnish or a polymer coating. This coating is especially used when the conductors are made of copper. In case they are made of aluminium such a coating is only optional, as the aluminium usually has a passivation layer on its surface which acts as an isolating layer.

Finally, the conductors and the tube may also be embedded in a flexible casting or a flexible coating. According to this embodiment, the whole conductor means is casted or coated in a flexible material, preferably a polymer or plastic material which is flexible enough to allow the conductor means to be bent. It may also show elastic properties for allowing the elastic material to be stretched and compensated at bends with a smaller radius.

The invention also refers to a directly cooled magnetic coil comprising at least one conductor means as depicted above forming a coil winding. The coil itself is preferably a gradient coil for a magnetic resonance apparatus.

Finally, the invention refers to a magnetic resonance apparatus comprising at least one coil as depicted above.

BRIEF DESCRIPTION OF THE DRAWINGS

Further advantages of the invention are explained below in combination with various embodiments shown in the figures. The figures show:

FIGS. 2-10: Various principle sketches of different conductor means comprising a metal tube adapted to carry a liquid cooling means and several conductors having a higher conductivity than the metal tube, which conductors are arranged around the tube.

DETAILED DESCRIPTION

Figure 1:
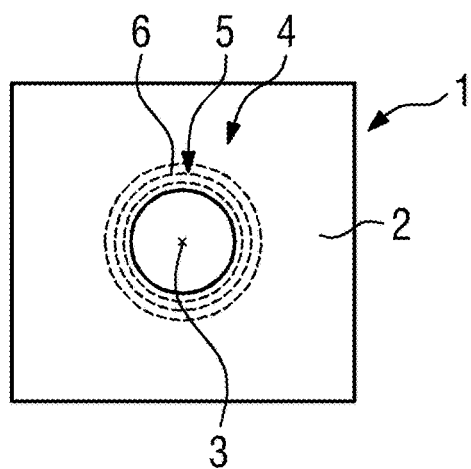
FIG. 1: A principle sketch of an inventive magnetic resonance apparatus comprising an inventive gradient coil.

FIG. 1 shows a principle sketch of an inventive magnetic resonance apparatus comprising a housing 2 with a central bore 3 into which an object, for example a patient, to be imaged is arranged.

In the housing 2 among others a gradient coil 4 is arranged comprising several magnetic coils 5, which are usually embedded in a hardened grouting material, usually a polymer. Each coil is made of an inventive conductor means 6 being wound into a respective geometry needed for creating the respective magnetic field. The setup and the properties of such a gradient coil 4 are known.

Figure 2:
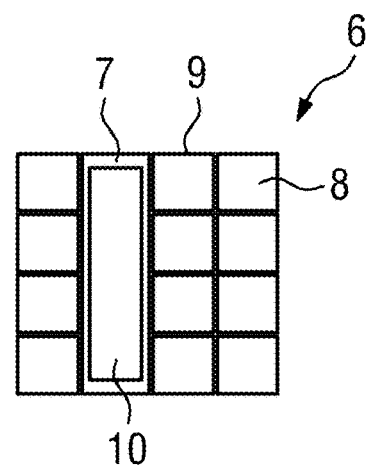

FIG. 2 shows a first embodiment of an inventive conductor means 6. The conductor means is a directly coolable multifilament conductor means. It comprises a cooling tube 7 arranged in the center of the conductor means 6. The cooling tube 7 is adapted to carry a fluid cooling means through a central channel 10 which is issued to cool the conductor means 6 which gets heated under operations due to the current being carried by the conductor means 6 and due to eddy currents. The tube 7 is made of metal, preferably steel, especially stainless steel. It has a rectangular cross section, with the wall thickness being between 0.5-1 mm. The width of the tube 7, seen in the horizontal direction, is clearly smaller than its height. The width may for example be between 2-4 mm, while the height is between 6-10 mm.

At the two opposing long sides of the tube 7 several conductors 8 also having a rectangular shape are arranged in a stacked manner. Each stack comprises for example four conductors 8. The conductors having a higher electrical conductivity than the metal tube are made of copper or aluminium. In case they are made of copper they preferably comprise an isolating surface coating 9, preferably a varnish or a polymer coating. In case they are made of aluminium such a coating is optional due to the passivation layer usually present on an aluminium surface.

The rectangular conductors, which may also have a square cross section, for example have a width between 2-4 mm and a height between 2-4 mm, while also these geometry parameters are only exemplary.

The conductors 8 are stacked above and adjacent to each other, but are not fixed to each other. They are also not fixed to the tube 7. This allows a certain movement of the respective components relative to each other, so that the conductor means 6 can be bent and wound into a coil form.

The heat produced in operation of the conductor means respectively the coil is transported to the metal tube 7 having a low thermal resistance, so that the heat can be transferred to the cooling means flowing through the hollow tube 7. This allows for a very effective cooling of the cooling means 6. Aside that the metal tube 7 also acts as a filament carrying the operational current. As it has a lower conductivity compared to the electric conductivity of the copper or aluminium conductors it is possible, especially when the wall thickness of the tube 7 is small, that the tube 7 has an efficiently large hollow cross section, so that the necessary flow rate of cooling fluid through the tube 7 can be realized.

Figure 3:
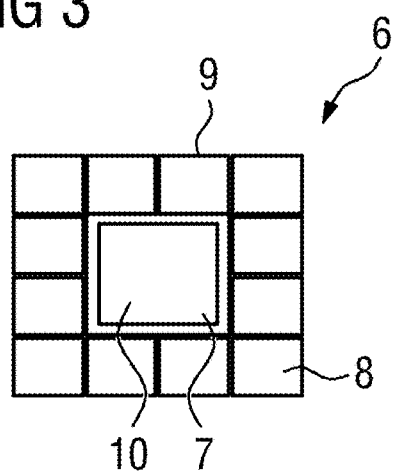

FIG. 3 shows another embodiment of an inventive conductor means 6, with the same reference numbers being used for the same components. Also, this conductor means comprises a hollow rectangular tube 7 being made of a metal having a lower electrical conductivity than the conductors 8 being arranged around all four sides of the rectangular tube 7. The conductors 8 are made of copper or aluminium with an optional isolating surface coating 9, for example a varnish or a polymer coating.

Figure 4:
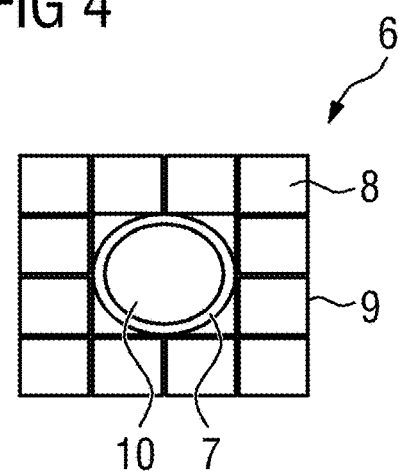

FIG. 4 shows an embodiment of an inventive conductor means 6 which is comparable to the embodiment of FIG. 3. Different to FIG. 3 the hollow tube 7 of FIG. 4 has a circular or oval cross section. The conductors 8 are arranged around the tube 7, comparable to the embodiment of FIG. 3.

Figure 5:
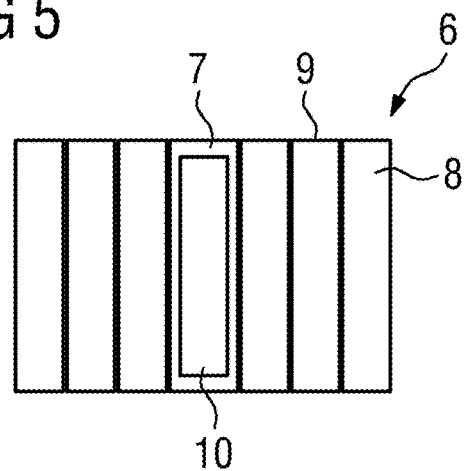

FIG. 5 shows an embodiment of a cooling means 6 with a rectangular metal tube 7 and several conductors 8 also having a rectangular shape with a width and height comparable to the dimensions of the tube 7. In this embodiment at each long side of the tube 7 three conductors 8 are arranged, each comprising an optional isolating surface coating 9. Also, this embodiment allows a very good heat transfer to the cooling means flowing through the metal tube 7, which itself acts as a filament conductor.

Figure 6:
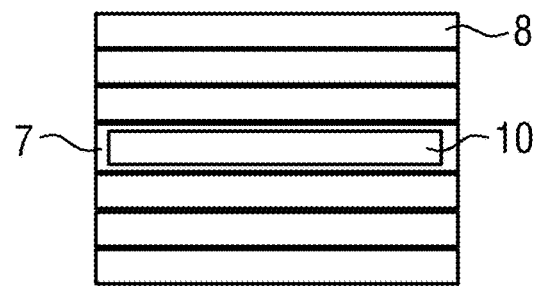

FIG. 6 shows an embodiment comparable to FIG. 5. It comprises a hollow tube 7 made of metal having a lower conductivity than the metal conductors 8. The tube 7 and the conductors 8 are arranged in a horizontal direction, with three conductors 8 being stacked above each other and arranged at each side of the tube 7. Also here the geometry of each conductor 7 is comparable to the tube geometry.

Figure 7:
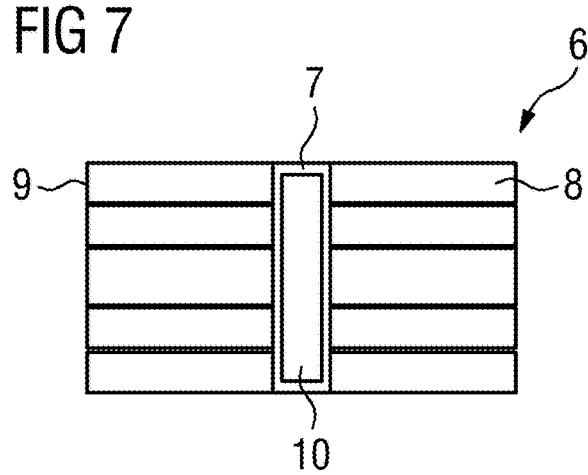

FIG. 7 shows a conductor means 6, with a hollow tube 7 with a vertical orientation and with respective conductors 8 having a horizontal orientation, which are arranged at both long sides of the tube 7. In this embodiment at each side five conductors 8 are arranged. The conductor 8 in the middle of each conductor stack is thicker than the other conductors being arranged below and above the center conductor. By changing the cross section the electrical properties, especially the effective conductor cross section, may be varied and adjusted.

FIG. 8 shows an embodiment of a conductor means 6 with a circular tube 7 being arranged in the center of the circular arrangement. Through its central channel 10 the liquid cooling means flows for transporting the heat away from the conductor means 6. The circular tube has an outer diameter between 2-10 mm, especially between 3-7 mm and is made of a metal having a lower electrical conductivity compared to the electrical conductivity of the conductors 8 arranged around the circular tube 7. The conductors 8 also have a circular cross section with a diameter also chosen between 2-10 mm, especially between 3-7 mm, but with a preferably smaller diameter compared to the diameter of the tube 7. The conductors 8 may also comprise an isolating surface layer 9, especially when they are made of copper. The conductors 8 may be twisted around the central tube 7.

FIG. 9 shows an embodiment of a conductor means 6 which also comprises a hollow circular tube 7 around which the circular conductors 8 are arranged. In this embodiment the whole setup is casted into a flexible casting 11 made of a polymer or plastic material, which preferably also has elastic properties. The casting 11 fixes the conductors 8 relative to the tube 7, with the conductors still being in a thermal connection to the tube 7. Due to its flexibility and elasticity it is possible to bend the conductor means 6, while the flexibility and elasticity allow for stretching and compressing at the respective bends and also allows for a certain movement of the conductors 8 in the bending region.

The conductors 8 may have an isolating surface coating 9, but this coating especially in this case is optional.

Finally, FIG. 10 shows a conductor means 6 comprising a circular hollow tube 7 and circular conductors 8 being arranged around the tube 7. Again, the conductors are made of a metal having a higher electrical conductivity than the metal tube 7. The conductors 8 may have an optional isolating surface layer 9.

In this embodiment a flexible or elastic coating 12 is arranged around the conductors 8 encasing the whole conductor means.

Although the casting 11 or the coating 12 are shown only at the embodiments of FIGS. 9 and 10 with the circular tube 7 and the circular conductors 8, it is to be noted that also the other embodiments shown in FIGS. 2 to 7 may certainly be embedded in a casting 11 or in a coating 12 if need be.

Although the present invention has been described in detail with reference to the preferred embodiment, the present invention is not limited by the disclosed examples from which the skilled person is able to derive other variations without departing from the scope of the invention.

The invention claimed is:

1. A directly coolable multifilament conductor for a magnetic gradient coil of a magnetic resonance apparatus, comprising at least two electric conductors and at least one cooling tube disposed between the conductors and configured to carry a fluid coolant to provide cooling and to carry a current to minimized eddy currents, wherein the cooling tube is a metal conductor having a lower electrical conductivity than the conductors surrounding the tube, the cooling tube has a rectangular or a circular cross section, and the at least two electric conductors have a rectangular cross section.

2. The conductor according to claim 1, wherein the cooling tube comprises stainless steel, and the at least two conductors comprise copper or aluminum.

3. The conductor according to claim 1, wherein the cooling tube has a wall thickness of 0.5-1.5 mm.

4. The conductor according to claim 1, wherein the rectangular cooling tube has a width between 3 mm and 7 mm and a height between 3 mm and 7 mm.

5. The conductor according to claim 1, wherein the rectangular at least two electric conductors have a width between 1 mm and 5 mm and a height between 3 mm and 7 mm.

6. The conductor according to claim 1, wherein the at least two electric conductors are twisted around the cooling tube.

7. The conductor according to claim 1, wherein the at least two electric conductors comprise an isolating surface coating.

8. The conductor according to claim 7, wherein the isolating surface coating is a varnish or a polymer coating.

9. The conductor according to claim 1, wherein the at least two electric conductors and the cooling tube are embedded in a flexible casting or a flexible coating that allows the at least two electric conductors to be bent.

10. A directly cooled magnetic gradient coil comprising at least one directly coolable multifilament conductor according to claim 1 forming a coil winding.

11. The directly cooled magnetic gradient coil according to claim 10, wherein the directly cooled magnetic gradient coil is a directly cooled magnetic gradient coil for a magnetic resonance apparatus.

12. A magnetic resonance apparatus, comprising at least one directly cooled magnetic gradient coil according to claim 10.

13. The conductor according to claim 1, wherein the circular cooling tube has a diameter between 3 mm and 7 mm.

* * * * *